United States Patent
Yeo et al.

(10) Patent No.: US 11,169,437 B2
(45) Date of Patent: Nov. 9, 2021

(54) OPTICAL PROXIMITY CORRECTION (OPC) METHODS AND METHODS OF MANUFACTURING MASKS USING THE OPC METHODS

(71) Applicant: Samsung Electronics Co., Ltd., Suwon-si (KR)

(72) Inventors: Sangchul Yeo, Osan-si (KR); Narak Choi, Yongin-si (KR)

(73) Assignee: Samsung Electronics Co., Ltd.

( * ) Notice: Subject to any disclaimer, the term of this patent is extended or adjusted under 35 U.S.C. 154(b) by 84 days.

(21) Appl. No.: 16/849,258

(22) Filed: Apr. 15, 2020

(65) Prior Publication Data

US 2021/0072637 A1     Mar. 11, 2021

(30) Foreign Application Priority Data

Sep. 6, 2019 (KR) .......................... 10-2019-0110788

(51) Int. Cl.
*G03F 1/36* (2012.01)

(52) U.S. Cl.
CPC ...................... *G03F 1/36* (2013.01)

(58) Field of Classification Search
CPC ........................................................ G03F 1/36
USPC .............................................................. 430/5
See application file for complete search history.

(56) References Cited

U.S. PATENT DOCUMENTS

| | | |
|---|---|---|
| 6,525,806 B1 | 2/2003 | Smith |
| 7,934,172 B2 | 4/2011 | Ivonin et al. |
| 8,027,091 B2 | 9/2011 | Graeupner |
| 8,572,520 B2 | 10/2013 | Chou et al. |
| 8,637,211 B2 | 1/2014 | Fujimura et al. |
| 10,025,175 B2 | 7/2018 | Tsai et al. |
| 10,198,549 B2 | 2/2019 | Liu et al. |
| 2019/0163866 A1 | 5/2019 | Liu et al. |

OTHER PUBLICATIONS

Lam et al. "Accurate 3DEMF mask model for full-chip simulation" Proceedings vol. 8683, Optical Microlithography XXVI, SPIE Advanced Lithography (Apr. 12, 2013).

*Primary Examiner* — Christopher G Young
(74) *Attorney, Agent, or Firm* — Myers Bigel, P.A.

(57) ABSTRACT

An optical proximity correction method includes extracting edges of a layout of a pattern on a mask, including at least one edge of the layout that is a curvilinear edge, and generating an optical image of the pattern by applying an edge filter, which includes an any-angle filter corresponding to an angle of the curvilinear edge, to the extracted edges of the layout. The any-angle filter may be generated using source sector rotation to correspond to the angle of the curvilinear edge.

20 Claims, 17 Drawing Sheets

ORTHOGONAL

CURVILINEAR

OPTICAL PROXIMITY CORRECTION (OPC) METHODS AND METHODS OF MANUFACTURING MASKS USING THE OPC METHODS

REFERENCE TO PRIORITY APPLICATION

This application claims the benefit of Korean Patent Application No. 10-2019-0110788, filed Sep. 6, 2019, in the Korean Intellectual Property Office, the disclosure of which is incorporated herein in its entirety by reference.

BACKGROUND

The inventive concept relates to a method of manufacturing a mask and, more particularly, to an optical proximity correction (OPC) method and a method of manufacturing a mask using the OPC method.

In a semiconductor manufacturing process, a photolithography operation(s) using a mask may be performed to form a pattern on a semiconductor substrate, such as a wafer. The mask may briefly refer to a pattern transfer material in which a pattern shape including an opaque material is formed on a transparent base material. At the beginning of the manufacturing process, a required circuit may be designed, a layout of the circuit may be designed, and design data obtained using OPC may be transmitted as mask tape-out (MTO) design data. Thereafter, mask data preparation (MDP) may be performed based on the MTO design data, and a front end of line (FEOL) process (e.g., an exposure process) and a back end of line (BEOL) process (e.g., a defect inspection process) may be performed to manufacture a mask.

SUMMARY

The inventive concept provides an optical proximity correction (OPC) method, which may effectively correct a mask three-dimensional (3D) effect on a curvilinear pattern, and a method of manufacturing a mask using the OPC method.

According to an aspect of the inventive concept, there is provided an OPC method, which includes extracting edges of a layout of a pattern on a mask, and generating an optical image of the pattern by applying an edge filter to the edges of the layout. The edges include a curvilinear edge, and the edge filter includes an any-angle filter corresponding to an angle of the curvilinear edge.

According to another aspect of the inventive concept, there is provided an OPC method, which includes: (i) designing a layout of a pattern on a mask, (ii) extracting edges of the layout, (iii) generating a first optical image of the pattern using thin mask approximation, (iv) generating a second optical image of the pattern by applying an edge filter to the edges of the layout, and (v) generating a final optical image of the pattern by combining the first optical image with the second optical image. The edges include a curvilinear edge, and the edge filter includes an any-angle filter corresponding to an angle of the curvilinear edge.

According to another aspect of the inventive concept, there is provided a method of manufacturing a mask. The method includes extracting edges of a layout of a pattern on a mask, generating an optical image of the pattern by applying an edge filter to the edges, generating an OPC model based on the optical image, obtaining design data about the mask by performing a simulation using the OPC model, transmitting the design data as mask tape-out (MTO) design data, preparing mask data based on the MTO design data, and performing an exposure process on a substrate for the mask, based on the mask data. The edges include a curvilinear edge, and the edge filter includes an any-angle filter corresponding to an edge of the curvilinear edge.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
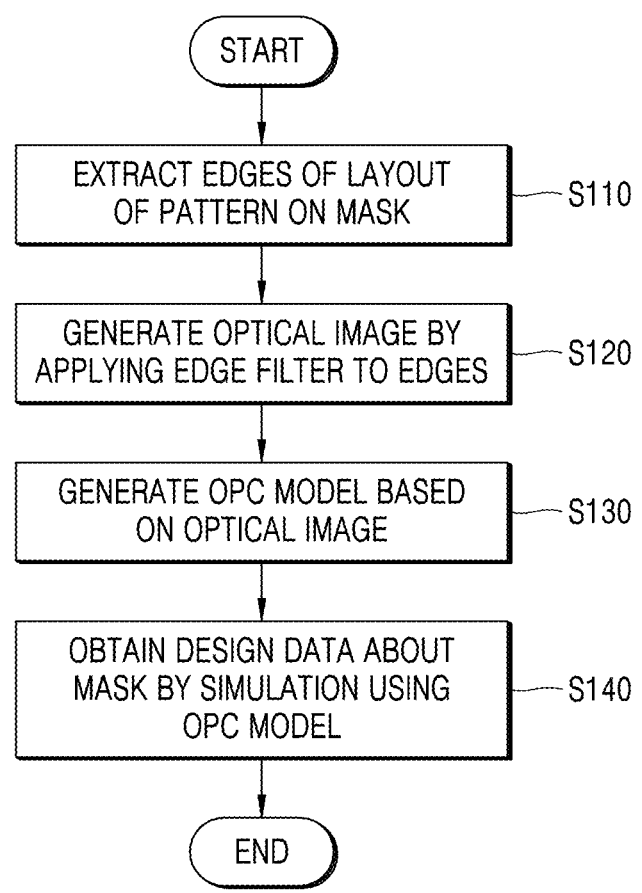
FIG. 1 is a flowchart of operations of an optical proximity correction (OPC) method according to an embodiment.

Hereinafter, embodiments will be described in detail with reference to the accompanying drawings. The same reference numerals are used to denote the same elements in the drawings, and repeated descriptions thereof will be omitted.

Figure 2A:
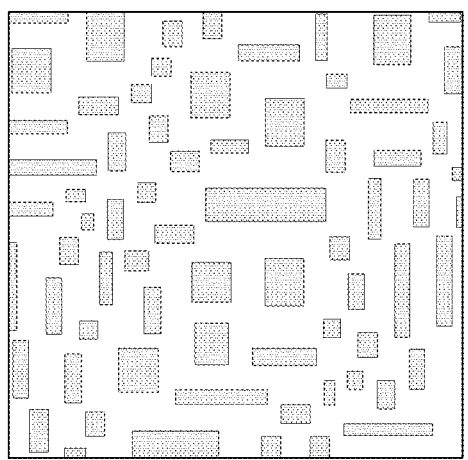
FIG. 2A is a conceptual diagram showing a shape of a pattern on a mask in an OPC method of the related art.
Figure 2B:
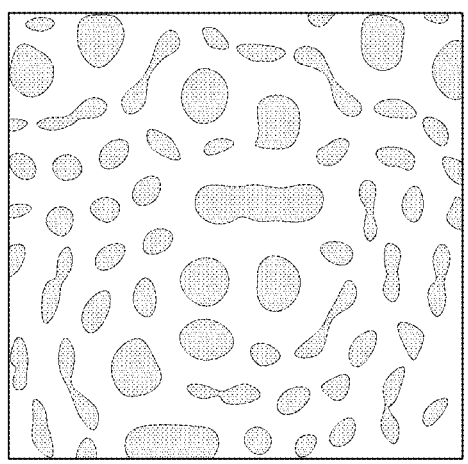
FIG. 2B is a conceptual diagram showing a shape of a pattern on a mask in an OPC method according to an embodiment.
Figure 3A:
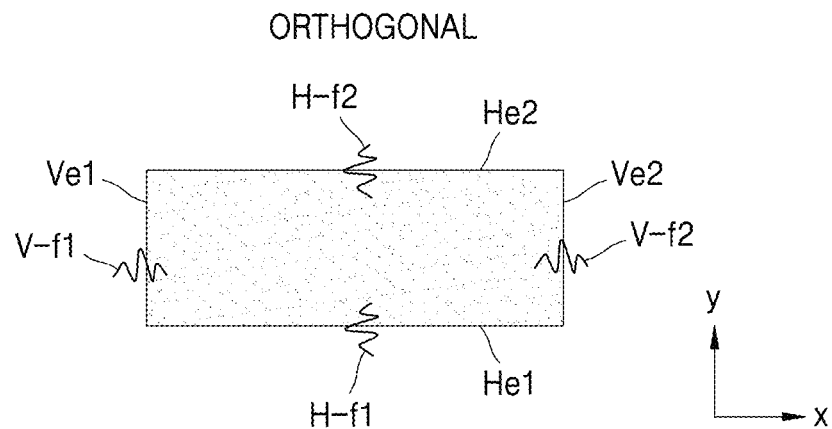
FIGS. 3A to 3C are conceptual diagrams for explaining a pattern including an orthogonal edge, a pattern including a curvilinear edge, and an angle of the curvilinear edge.
Figure 3B:
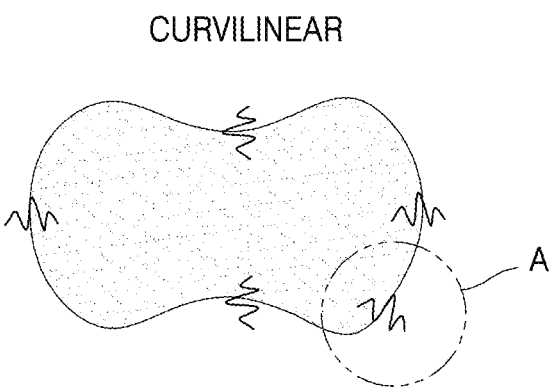
Figure 3C:
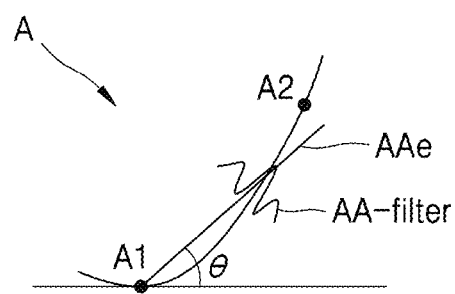

FIG. 1 is a flowchart of processes of an optical proximity correction (OPC) method according to an embodiment. FIG. 2A is a conceptual diagram showing a shape of a pattern on a mask in an OPC method of the related art. FIG. 2B is a conceptual diagram showing a shape of a pattern on a mask in an OPC method according to the present embodiment. FIGS. 3A to 3C are conceptual diagrams for explaining a pattern including an orthogonal edge, a pattern including a curvilinear edge, and an angle of a curvilinear edge.

Referring to FIGS. 1 to 3C, in the OPC method according to the present embodiment, to begin with, edges of a layout of a pattern on a mask may be extracted (S110). Here, the pattern on the mask may refer to a pattern that is transferred on a substrate, such as a wafer, using an exposure process to form a target pattern on the substrate. In general, a shape of the target pattern on the substrate may be different from a shape of the pattern on the mask due to characteristics of the exposure process. In addition, since the pattern on the mask is reduced, projected, and transferred on the substrate, the pattern on the mask may have a larger size than the target pattern on the substrate.

In addition, the layout of the pattern on the mask may have a one-dimensional (1D) or two-dimensional (2D) shape. Here, the 1D shape may not mean a line without an area but a shape extending in one direction, such as a line & space pattern. The edges may correspond to lines that surround the layout of the pattern. In some embodiments, the edges may correspond to lines that surround a space between the layouts of patterns. Also, the edges may correspond to both the lines surrounding the layout of the pattern and the lines surrounding the space between the layouts of the patterns.

Next, an optical image may be generated by applying an edge filter to the extracted edges (S120). Here, the optical image may be a mask near-field image calculated on a rear surface of the mask immediately after light passes through the mask. The edge filter may be a filter capable of generating an optical image of a portion corresponding to the edges, and values of the edge filter may vary according to positions and characteristics of the edges. An edge filter corresponding to each of the edges may be applied to the corresponding edge, and thus, an optical image corresponding to each of the edges may be generated.

The generation of the optical image for the pattern on the mask will now be described in further detail. In recent years, to overcome the patterning limit and ensure process margins, a shape of the pattern on the mask may extend from an orthogonal shape shown in FIG. 2A to a curvilinear shape shown in FIG. 2B. In addition, intensive research is being conducted into an OPC method for a curvilinear pattern. In general, the pattern on the mask may have a thickness that cannot be neglected as compared to an exposure wavelength. Accordingly, a precise OPC method may require calculating an optical image considering a mask topography effect, that is, a mask 3D effect.

To perform OPC on a large-area mask, it may be necessary to calculate the optical image in a short amount of time. Accordingly, it may not be appropriate to use a rigorous simulation method, which takes a long time, to calculate the optical image. Here, the rigorous simulation method may refer to, for example, an electromagnetic simulation method, such as a rigorous coupled-wave analysis (RCWA) method or a finite difference time domain (FDTD) simulation method. In the rigorous simulation method, a mask near-field image that accurately reflects a shape of a pattern on a mask may be obtained, but there is a problem in that calculations take too much time.

Accordingly, an optical image of a mask may be calculated using a more compact and computationally efficient simulation model, and a domain decomposition method (DDM) may be a widely used method of calculating the optical image of the mask. The DDM may include dividing a pattern on a mask into respective domains and obtaining an optical image using edge filter approximation. For example, the DDM may store edge filter values, which are previously calculated for each width/space of the pattern using the FDTD simulation method, in a filter library and calculate an optical image of each pattern by using an edge filter value corresponding to each edge, which is taken from the filter library, so that the calculated optical image may be almost similar to an optical image calculated using the rigorous simulation method. Accordingly, the DDM may generate an optical image in which a 3D effect of the mask may be effectively corrected.

Here, the optical image obtained using edge filter approximation may include a first optical image obtained using thin mask approximation (TMA) and a second optical image using an edge filter. In other words, the first optical image may be combined with the second optical image to generate a final optical image of the corresponding pattern. For reference, the TMA, which is also called Kirchhoff approximation, may refer to a near-field image, which is calculated on the assumption that a mask has a very small thickness of substantially 0, an open portion of the mask completely transmits light, and a blocked portion of the mask completely blocks light. The TMA will be described in further detail with reference to FIG. 4B. A principle for generating a final optical image using the TMA and the edge filter will be described in further detail below with reference to FIGS. 4A to 4E.

In the OPC method of the present embodiment, the edge filter may further include an any-angle filter together with the vertical (90°) filter and the horizontal (0°) filter. Here, the vertical filter may refer to an edge filter to be applied to an edge vertical to one set direction, based on the one direction, while the horizontal filter may refer to an edge filter to be applied to an edge parallel to the one direction. In addition, the any-angle filter may refer to an edge filter to be applied to an edge of an arbitrary angle, which is neither vertical nor parallel to the one direction. When non-orthogonal edges are present in a pattern to be formed, the any-angle filter may be used for, for example, a curvilinear edge. The definition of the any-angle filter and a method of forming the any-angle filter will be described in further detail below with reference to FIGS. 5A and 5B.

The edge filter will now be described in further detail. Four edges may be extracted from an orthogonal polygon shown in FIG. 3A. Here, a polygon may be referred to as a polygon including a combination of respective vertexes of a pattern corresponding thereto. Also, the four edges may be divided into two vertical edges Ve1 and Ve2, which are vertical to a first direction (x direction), and two horizontal edges He1 and He2, which are parallel to the first direction (x direction), on the basis of the first direction (x direction). In addition, vertical filters V-f1 and V-f2 may be applied to the extracted vertical edges Ve1 and Ve2 corresponding thereto, and horizontal filters H-f1 and H-f2 may be applied to the extracted horizontal edges He1 and He2 corresponding thereto, and thus, an optical image corresponding to each edge may be generated. In FIG. 3A, each of the vertical filters V-f1 and V-f2 and the horizontal filters H-f1 and H-f2 is illustrated in a simple wave form for brevity.

In a curvilinear polygon shown in FIG. 3B, edges may be extracted in a curvilinear form, and a vertical filter and a horizontal filter may not be applied to curvilinear edges. According to an OPC method of the related art, curvilinear edges of an extreme ultraviolet (EUV) light source were de-angled at 0° and 90°, and a vertical filter and a horizontal filter were applied to the curvilinear edges. Here, the de-angling of the curvilinear edges of the EUV light source at 0° and 90° may refer to changing the curvilinear edges into fine orthogonal edges, such as stepped edges. However, the method of de-angling the curvilinear edges of the EUV light source at 0° and 90° may require too much computational time and greatly degrade the accuracy of a calculated optical image.

According to the OPC method of the related art, an inverse lithography technology (ILT) method may be applied to a curvilinear polygon of a deep ultraviolet (DUV) light source. The ILT method may include inversely calculating a shape of a pattern on a mask based on a shape of a pattern on a wafer. The ILT method may be disadvantageous in terms of time and costs because patterns need to be actually formed on the wafer and several trial-and-error cycles are often required.

In the OPC method of the present embodiment, an optical image may be generated by applying an any-angle filter to the curvilinear edge corresponding thereto, and thus, an optical image in which a mask 3D effect may be effectively corrected may be generated. Also, an OPC model may be generated based on the optical image, and optimum design data about a mask may be obtained by performing a simulation using the OPC model. Furthermore, in the OPC method of the present embodiment, a high-quality mask having reliability may be manufactured based on the optimum design data about the mask, which is obtained using the OPC method. As a result, by using the mask in a process of patterning a product, the OPC method of the present embodiment may greatly contribute to improving the performance and reliability of the product.

The application of the any-angle filter to the curvilinear edge may not mean applying an any-angle filter precisely corresponding to a curve to the curvilinear edge, but instead refer to: (i) extracting an any-angle line representing the curvilinear edge as an any-angle edge, and (ii) applying an any-angle filter corresponding to a linear any-angle edge to the curvilinear edge.

More specifically, FIG. 3C is an enlarged view of a region A illustrated as a two-point chain line in FIG. 3B. An any-angle edge AAe may be extracted as a line having an average slope with respect to a horizontal line within a set range of the curvilinear edge, for example, between a first position A1 and a second position A2 on the curvilinear edge. As shown in FIG. 3C, the any-angle edge AAe may have an angle θ corresponding to the average slope with respect to the horizontal line. An optical image of the curvilinear edge may be generated by applying a corresponding any-angle filter AA-f to the extracted any-angle edge AAe. The definition of the any-angle filter and a method of forming the any-angle filter will be described in further detail with reference to FIGS. 5A and 5B.

After the optical image is generated, an OPC model may be generated based on the optical image (S130). Thereafter, design data about a mask may be obtained by performing a simulation using the OPC model (S140).

The above-described processes of generating the optical image, generating the OPC model, and obtaining the design data may be referred to as an OPC method. However, the OPC method may further include various other processes. The overall description of the OPC method is as follows.

With the downscaling of patterns, an optical proximity effect (OPE) may occur due to influence between neighbouring patterns during an exposure process, and the OPC method may refer to a method of correcting a layout of the pattern to inhibit and overcome the OPE. The OPC method may be broadly divided into a rule-based OPC method and a simulation-based or model-based OPC method. The OPC method of the present embodiment may be, for example, a model-based OPC method. The model-based OPC method may be advantageous in terms of time and cost because the model-based OPC method uses only measurement results of representative patterns without having to measure all of a large number of test patterns.

The OPC method may include not only a method of modifying the layout of the pattern but also a method of adding sub-lithographic features, which are called serifs, on corners of the pattern, or a method of adding sub-resolution assist features (SRAFs), such as scattering bars.

The performing of the OPC method may initially include preparing basic data for OPC. Here, the basic data may include data about shapes of patterns of a sample, positions of the patterns, types of measurements, such as measurements of spaces or lines of the patterns, and basic measurement values. Also, the basic data may include information about a thickness, a refractive index, and a dielectric constant of photoresist (PR) and include a source map for a shape of an illumination system. However, the basic data is not limited to the above-described examples of data.

After the basic data is prepared, an optical OPC model may be generated. The generation of the optical OPC model may include optimizing a defocus stand (DS) position and a best focus (BF) position in an exposure process. Also, the generation of the optical OPC model may include generating an optical image considering diffraction of light or an optical state of exposure equipment. The optical image obtained using the edge filter approximation as described above may be used in the generation of the optical OPC model. However, the generation of the optical OPC model is not limited to the above description. For example, the generation of the optical OPC model may include various contents related to an optical phenomenon in the exposure process.

After the optical OPC model is generated, an OPC model for PR may be generated. The generation of the OPC model for the PR may include optimizing a threshold value of the PR. Here, the threshold value of the PR may refer to a threshold value at which a chemical change occurs during an exposure process. For example, the threshold value may be an intensity of exposure light. Also, the generation of the OPC model for the PR may include selecting an appropriate model form from among various PR model forms.

A combination of the optical OPC model and the OPC model for the PR may be typically referred to as an OPC model. Accordingly, a combination of the process of generating the optical OPC model and the process of generating the OPC model for the PR may be referred to as a process of generating the OPC model, that is, an OPC modelling process. Hereinafter, unless otherwise defined, the OPC model may be interpreted as a combined concept of the optical OPC model and the OPC model for the PR.

After the OPC model is generated, the OPC model may be verified. The verification of the OPC model may be performed by calculating a root mean square (RMS) value of a critical dimension (CD) error and checking an edge placement error (EPE). When the OPC model is included in set specifications, the verification of the OPC model may be completed, and the corresponding OPC model may be selected as an OPC model for simulation. If the OPC model is not included in the set specifications, an operation of generating an OPC model, that is, an operation of generating an optical OPC model and/or an OPC model for PR, may be performed again.

After the OPC model is verified, a simulation may be performed using the corresponding OPC model. By performing the simulation using the OPC model, design data of a mask, which is close to actual measurements, may be obtained. The design data of the mask, which is obtained using the simulation, may be transmitted as mask tape-out (MTO) design data to a mask manufacturing team to manufacture masks later.

FIGS. 4A to 4E are conceptual diagrams for explaining a principle for generating an optical image of a pattern on a mask by using an edge filter, wherein the pattern on the mask is the pattern including the orthogonal edge of FIG. 3A.

Figure 4A:
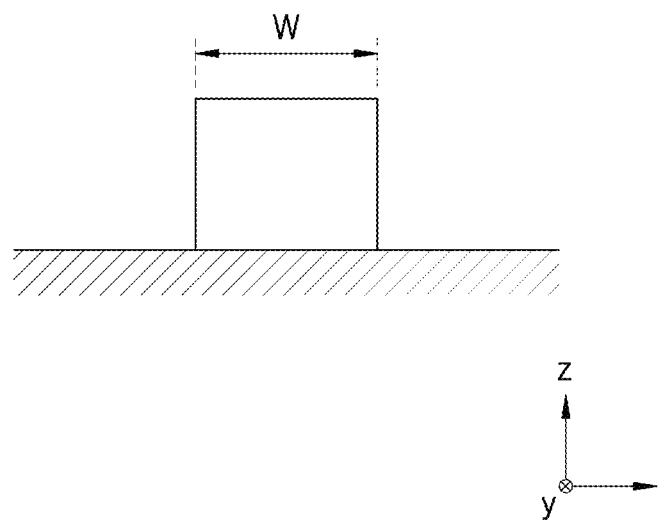
FIGS. 4A to 4E are conceptual diagrams for explaining a principle for generating an optical image of a pattern on a mask by using an edge filter, wherein the pattern on the mask is the pattern including the orthogonal edge of FIG. 3A.

FIG. 4A illustrates a shape of a pattern formed on a wafer using a mask. A vertical section of a 1D line pattern is shown in FIG. 4A for brevity. The 1D line pattern may extend in a second direction (y direction) and have a predetermined width W in a first direction (x direction) as shown in FIG. 4A.

Figure 4B:
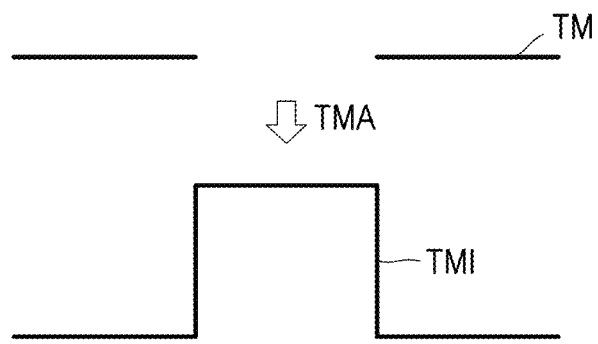

FIG. 4B illustrates an optical image in a case in which an ideal thin mask TM is used to form the pattern shown in FIG. 4A. That is, FIG. 4B illustrates an optical image obtained by thin mask approximation TMA (hereinafter, referred to as a 'thin mask image TMI'). Here, the ideal thin mask TM may be a mask having a very small thickness, an open portion of the ideal thin mask TM may completely transmit light, and a blocked portion thereof may completely block light. The thin mask image TMI illustrated under the thin mask TM may have a shape substantially similar to that of the pattern formed on the wafer of FIG. 4A.

Figure 4C:
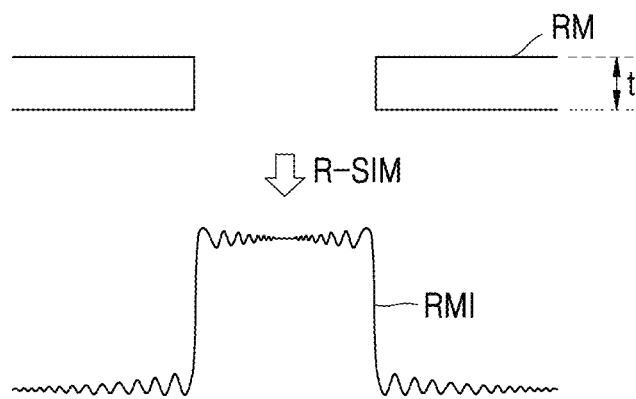

FIG. 4C illustrates a real mask RM used to form a pattern. The real mask RM may have a predetermined thickness t, and thus, an optical image obtained through a real mask RM (hereinafter, referred to as a 'real mask image RMI') may be different from the thin mask image TMI. An optical image illustrated under the real mask RM may be an optical image calculated by an R-SIM, such as an FDTD simulation. The optical image calculated using the R-SIM may be substantially the same as the real mask image RMI.

Figure 4D:
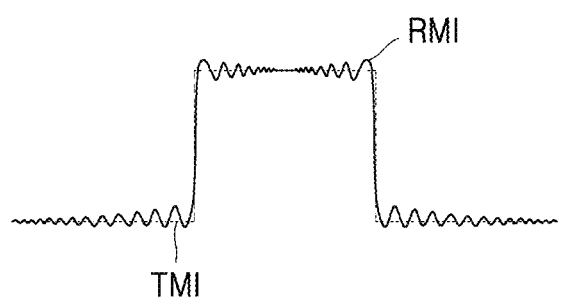

Referring to FIG. 4D, a real mask image RMI and a thin mask image TMI are shown together. In FIG. 4D, the real mask image RMI is illustrated with a solid line, and the thin mask image TMI is illustrated with a dashed line. As shown in FIG. 4D, the real mask image RMI may be different from the thin mask image TMI. In particular, it may be confirmed that portions of the real mask image RMI and the thin mask image TMI, which correspond to edges of a pattern, greatly differ from each other. In other words, the real mask image RMI and the thin mask image TMI may become more similar to each other farther away from the portions corresponding to the edges of the pattern.

Figure 4E:
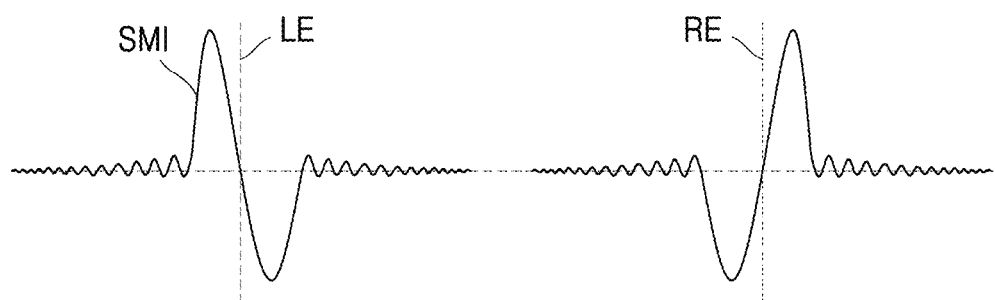

FIG. 4E illustrates a shape of a difference ("subtraction") mask image SMI, which is obtained by subtracting a thin mask image TMI from a real mask image RMI. As described above, it may be seen that a portion of a difference mask image SMI, which is adjacent to each of a left edge LE and a right edge RE, has a large amplitude, and an amplitude of the difference mask image SMI is reduced far away from each of the left edge LE and the right edge RE. For brevity, the difference mask image SMI shown in FIG. 4E shows an enlarged scale of amplitude as compared to the real mask image RMI and the thin mask image TMI.

Although FIG. 4E illustrates a case in which a portion of the difference mask image SMI corresponding to the left edge LE has the same shape as a portion of the difference mask image SMI corresponding to the right edge RE, the portions of the difference mask image SMI corresponding to the left and right edges LE and RE may exhibit different shapes for various reasons. For example, depending on whether light is obliquely incident on a mask or whether there is a pattern adjacent to the left edge LE and the right edge RE or according to a difference in a shape of a pattern, the portion of the different mask image SMI corresponding to the left edge LE may exhibit a different shape from the portion of the different mask image SMI corresponding to the right edge RE.

The portions of the difference mask images SMI corresponding to the left edge LE and the right edge RE may correspond to an edge filter. Accordingly, edges may be extracted from a layout of the pattern, and an edge filter corresponding to the edges may be applied, and thus, the difference mask image SMI (i.e., a first optical image) may be generated. Thereafter, by adding the thin mask image TMI (i.e., a second optical image) obtained using TMA to the first optical image, an optical image, which is substantially the same as the real mask image RMI, may be generated. Here, the real mask image RMI may be substantially the same as an optical image calculated using an R-SIM.

As a result, edge filter values (i.e., the first optical image) corresponding to edges may be previously calculated according to a width and space by using an R-SIM, such as an FDTD simulation, and be stored in a filter library. Thereafter, when an optical image for each pattern is calculated, an edge filter value corresponding to each edge may be taken from the filter library and used. Thus, an optical image that is substantially the same as the optical image calculated using the R-SIM may be calculated.

Figure 5A:
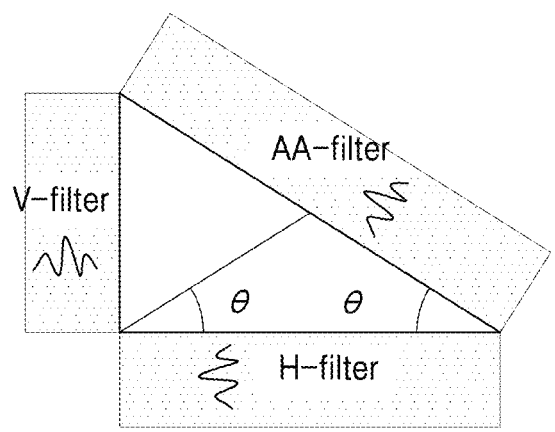
FIGS. 5A and 5B are conceptual diagrams for explaining the concepts of an any-angle filter to be applied to the pattern including the curvilinear edge of FIG. 3B and the rotation of a source sector.
Figure 5B:
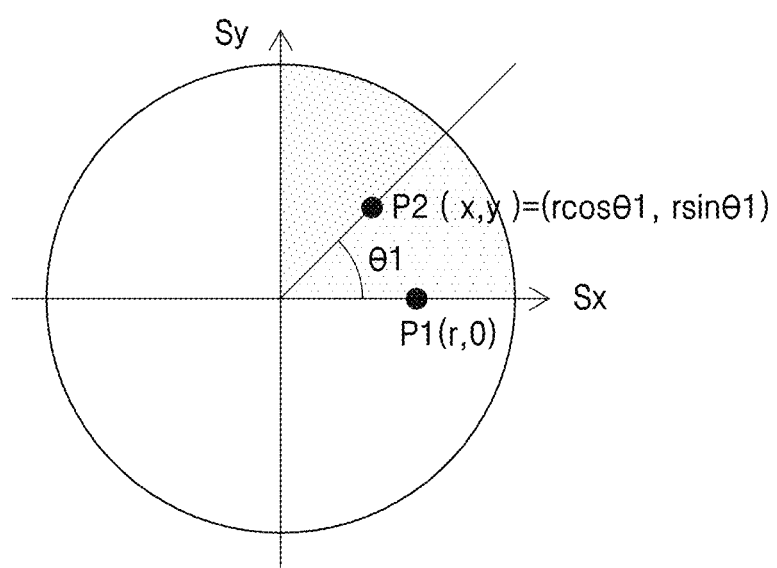

FIGS. 5A and 5B are conceptual diagrams for explaining the concepts of an any-angle filter AA-filter to be applied to the pattern including a curvilinear edge of FIG. 3B and the rotation of a source sector. Referring to FIG. 5A, the any-angle filter AA-filter may be expressed as a sum of a vertical filter V-filter and a horizontal filter H-filter to which a weight "w" is applied. For example, in a right-angled triangle of FIG. 5A, assuming that a base portion is the horizontal filter H-filter and a height portion is the vertical filter V-filter, the any-angle filter AA-filter may correspond to a hypotenuse (i.e., longest side of right triangle). Also, the any-angle filter AA-filter may be expressed as the sum of the vertical filter V-filter and the horizontal filter H-filter to which an appropriate weight w is applied according to an angle θ. For example, the any-angle filter (i.e., AA-filter) may be expressed by applying a weight to the vertical filter and the horizontal filter, according to the following relationship (Equation 1):

$$AA\text{-filter}=w*V\text{-filter}+(1-w)*H\text{-filter},$$

where "AA-filter" designates the any-angle filter, "V-filter" designates the vertical filter, "H-filter" designates the horizontal filter, and "w" designates the weight. In some embodiments, the weight w may be given by $\sin^2\theta$. Thus, when the angle $\theta$ is 0°, the any-angle filter AA-filter may correspond to the horizontal filter H-filter, but when the angle $\theta$ is 90°, the any-angle filter AA-filter may correspond to the vertical filter V-filter.

Although the any-angle filter AA-filter has been simply described as the sum of the vertical filter V-filter and the horizontal filter H-filter, the concept of source sector rotation may be applied to the generation of the any-angle filter AA-filter as described below with reference to FIG. 5B. Referring to FIG. 5B, as in the compact simulation model described above, edge filter values (e.g., vertical filter values and horizontal filter values), which are calculated using an R-SIM, such as an FDTD simulation, may be stored in a filter library. The vertical filter values and the horizontal filter values may be calculated at each position of the source sectors or a source points and stored. For example, FIG. 5B illustrates a light source in the form of a circular source. The circular source may be divided according to a sector or point, and vertical filter values and horizontal filter values may be calculated at a position of a corresponding sector and stored in the filter library.

In an orthogonal polygon, a sector may be designated based on a source, an edge filter value (i.e., a vertical filter and/or a horizontal filter value) corresponding to the corresponding sector may be directly taken from the filter library to calculate an optical image. However, in a curvilinear polygon, unlike in the orthogonal polygon, an any-angle filter may be defined or generated by source sector rotation or source point rotation and applied to the curvilinear polygon to calculate an optical image.

More specifically, in the curvilinear polygon, although a sector is defined based on a source, an edge filter value obtained by rotating the sector by an angle $\theta$ of a corresponding edge may be taken from the filter library instead of an edge filter value corresponding to the corresponding sector to calculate an optical image. Here, as described above with reference to FIG. 3C, the angle $\theta$ of the corresponding edge may be an angle formed by an any-angle edge AAe extracted from the curvilinear edge with respect to a horizontal line. For example, in FIG. 5B, assuming that a first point P1(r, 0) of a horizontal axis Sx corresponds to an any-angle edge having a first angle $\theta1$, an edge filter value of the corresponding any-angle edge may not be an edge filter value calculated at the first point P1(r, 0) but an edge filter value calculated at a second point P2(r cos $\theta1$, r sin $\theta1$) obtained by rotating the first point P1(r, 0)) by the first angle $\theta1$. As described above, when an edge filter value of an edge filter having an arbitrary angle other than 0° or 90° is calculated, the calculation of an edge filter value not at an original position of a source point but at a rotated position of the source point may be referred to as source sector rotation. Also, the calculation of the edge filter value by using the source sector rotation may include generating an any-angle filter of the curvilinear edge and calculating an any-angle filter value of the any-angle filter.

In addition, as described above, the angle $\theta$ of the corresponding curvilinear edge (e.g., the any-angle edge AAe) may be determined as the weight "w" using a sine function, and the weight w may be used as in Equation (1), and thus, the any-angle filter AA-filter may be expressed as a sum of the vertical filter V-filter and the horizontal filter H-filter.

But, because a reflective optical system (e.g., an EUV light source) does not need to consider a polarization, an any-angle filter may be generated only by source sector rotation. In contrast, since various polarizations (e.g., X, Y, XY, TE, and TM polarizations) are present in a transmissive optical system, such as a DUV light source, the any-angle filter may be generated considering the polarizations together with the source sector rotation. For example, in the DUV light source, the generation of the any-angle filter may further include polarization decomposition together with source sector rotation.

Figure 6A:
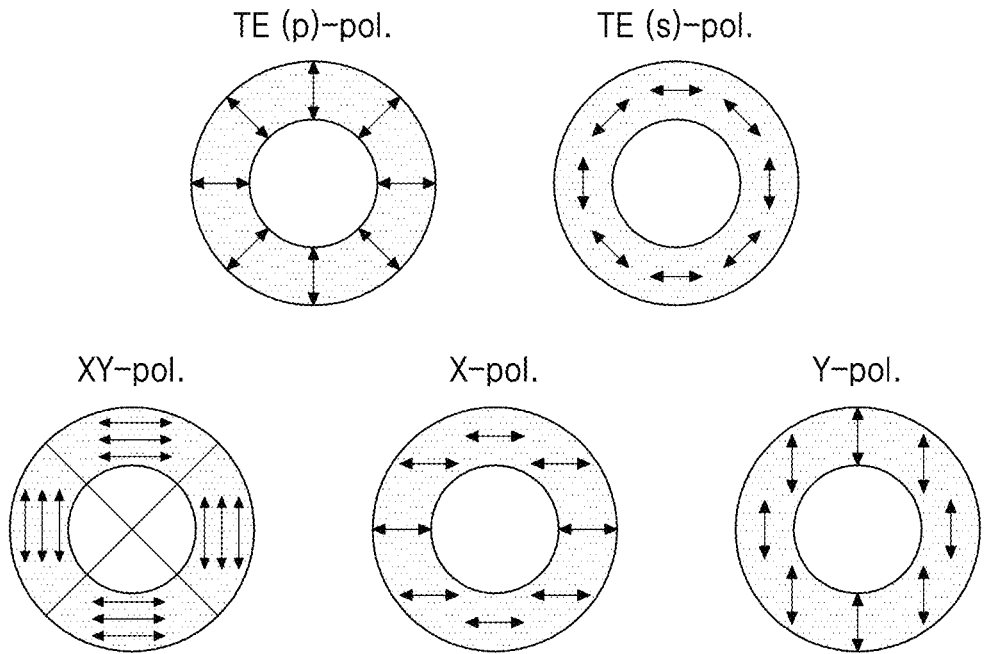
FIG. 6A is a conceptual diagram showing polarizations present in a transmissive optical system.
Figure 6B:
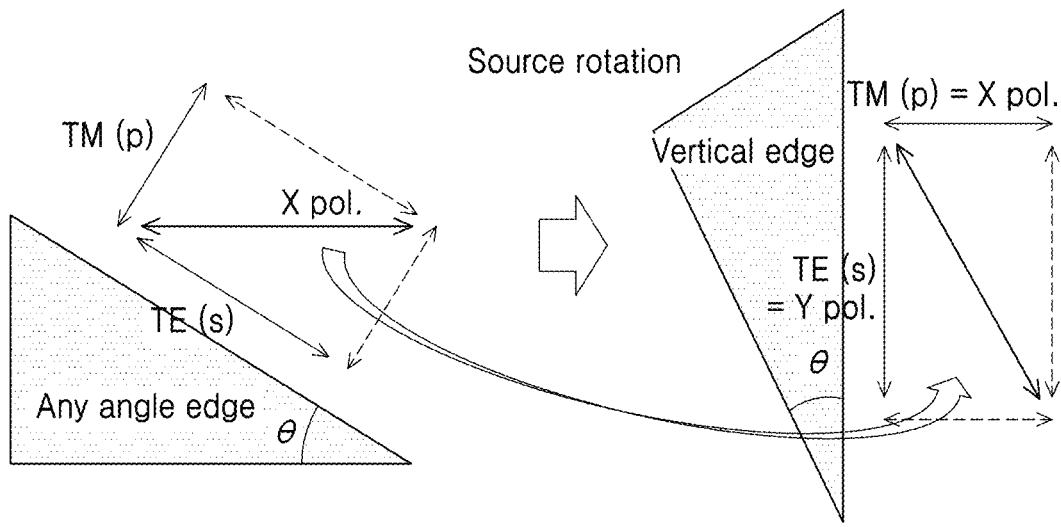
FIG. 6B is a conceptual diagram for explaining polarization decomposition.
Figure 7A:
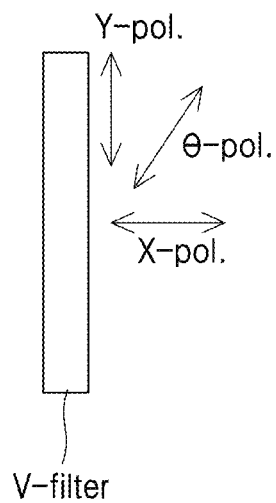
FIGS. 7A and 7B are conceptual diagrams for explaining a principle of expressing polarization decomposition using a vertical filter, a horizontal filter, and a weight in relation to an any-angle filter of FIG. 6B.
Figure 7B:
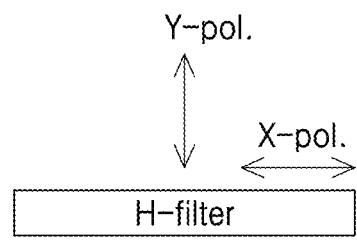

FIG. 6A is a conceptual diagram showing polarizations present in a transmissive optical system. FIG. 6B is a conceptual diagram for explaining polarization decomposition. FIGS. 7A and 7B are conceptual diagrams for explaining a principle of expressing polarization decomposition using a vertical filter, a horizontal filter, and a weight in relation to an any-angle filter of FIG. 6B.

Polarizations present in the transmissive optical system will now be briefly described with reference to FIG. 6A. Transverse magnetic-field (TM) polarization TM(p)-pol. may also be referred to as a horizontal polarization or p polarization and typically refer to electromagnetic waves in which an oscillation direction of an electric field is polarized parallel to an incidence plane. Transverse electric-field (TE) polarization TE(s)-pol. may also be referred to as a vertical polarization or s polarization and refer to electromagnetic waves in which an oscillation direction of an electric field is polarized vertically to an incidence plane. The X polarization X-pol, the Y polarization Y-pol, and XY polarization XY-pol. may be polarizations determined according to user's definitions. For example, when a polarization of a first direction (x direction) is defined as the X polarization X-pol, a polarization of a second direction (y direction) perpendicular to the X polarization X-pol. may be the Y polarization Y-pol, and a polarization in which the X polarization X-pol. and the Y polarization Y-pol. are distinguished by sectors and combined may correspond to the XY polarization XY-pol.

Referring to FIG. 6B, when a polarization is applied to each edge, the polarization may be decomposed and replaced by a linear combination of each vertical filter and each horizontal filter. For example, in FIG. 6B, an X polarization X pol. may be expressed as a vector sum of a TM polarization TM(p) and a TE polarization TE(s). As shown in FIG. 6B, when a source sector is rotated clockwise, since the TE polarization TE(s) corresponds to a vertical polarization, that is, a Y polarization X pol and the TM polarization TM(p) corresponds to a horizontal polarization, that is, an X polarization X pol. Thus, the X polarization X pol. after source sector rotation may be expressed as a vector sum of the X polarization X pol. and the Y polarization Y pol. after the rotation of the source sector.

For example, a polarization $\Delta D_x^x(r)$ of an any-angle filter of a 45° diagonal pattern may be expressed as a linear sum of the X polarization X pol. and the Y polarization Y pol. of the vertical filter and the horizontal filter as in Equation (2) by applying a sine function as a weight:

$$\Delta D_x^x(r) = \sin^2 45°* \Delta V_x^x(r) + \cos^2 45°* \Delta V_y^y(r) = \qquad (2)$$
$$(\Delta V_x^x(r) + \Delta V_y^y(r))/2 = (\Delta V_x^x(r) + \Delta H_x^x(r))/2,$$

where: $\Delta(r)$ denotes a signal value or light intensity of an edge filter value of an edge viewed from a distance r, $D_x^x$, D denotes an oblique or diagonal any-angle filter, a subscript denotes an input polarization, and a superscript denotes an output polarization. Thus, $D_x^x$ denotes an x polarization of an any-angle filter, $V_x^x$ denotes an x polarization of the vertical filter, $V_y^y$ denotes a y polarization of the vertical filter, and $H_x^x$ denotes an x polarization of the horizontal filter.

A polarization $\Delta D_x^x(r)$ of an any-angle filter of a pattern having an edge with an arbitrary angle θ may be expressed as a linear sum of the X polarization X pol. and the Y polarization Y pol. of the vertical filter and the horizontal filter as in Equation (3):

$$\Delta D_x^x(r) = \sin^2\theta^{\circ*}\Delta V_x^x(r) + \cos^2\theta^{\circ*}\Delta V_y^y(r) = \\ w^*\Delta V_x^x(r) + (1-w)^*\Delta V_y^y(r) = w^*\Delta V_x^x(r) + (1-w)^*\Delta H_x^x(r). \quad (3)$$

In a process of deriving Equation (2) or Equation (3), $\Delta V_y^y(r)$ may be replaced by $\Delta H_x^x(r)$, which may be understood with reference to FIGS. 7A and 7B. That is, a polarization θ-pol. of the vertical filter V-filter at an arbitrary angle θ may be expressed as a vector sum of the X polarization X pol. and the Y polarization Y pol. of the vertical filter V-filter.

As can be seen from FIG. 7A, the Y polarization Y pol. of the vertical filter V-filter may be a polarization parallel to the vertical filter V-filter, and an X polarization X pol. of the vertical filter V-filter may be a polarization perpendicular to the vertical filter V-filter. And, as can be seen from FIG. 7B, the Y polarization Y pol. of the horizontal filter H-filter may be polarization perpendicular to the horizontal filter V-filter, and the X polarization X pol. of the horizontal filter H-filter may be a polarization parallel to the horizontal filter V-filter. The Y polarization Y pol. of the vertical filter V-filter may be substantially the same polarization as the X polarization X pol. of the horizontal filter H-filter in that a polarization is parallel to a direction of a filter in terms of the concept of the polarization. Accordingly, $\Delta V_y^y(r)$ may be replaced by $\Delta H_x^x(r)$.

Figure 8A:
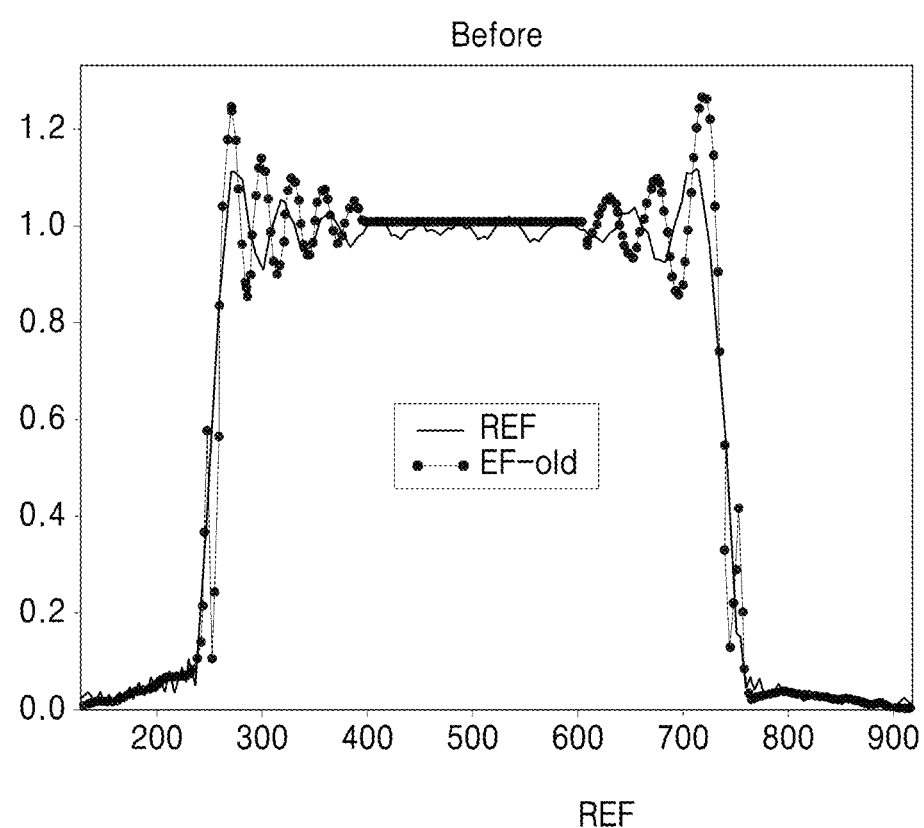
FIGS. 8A and 8B are graphs showing near-field images of a mask having an any-angle one-dimensional (1D) pattern to show a difference before and after an any-angle filter is applied to the mask having the any-angle 1D pattern.
Figure 8B:
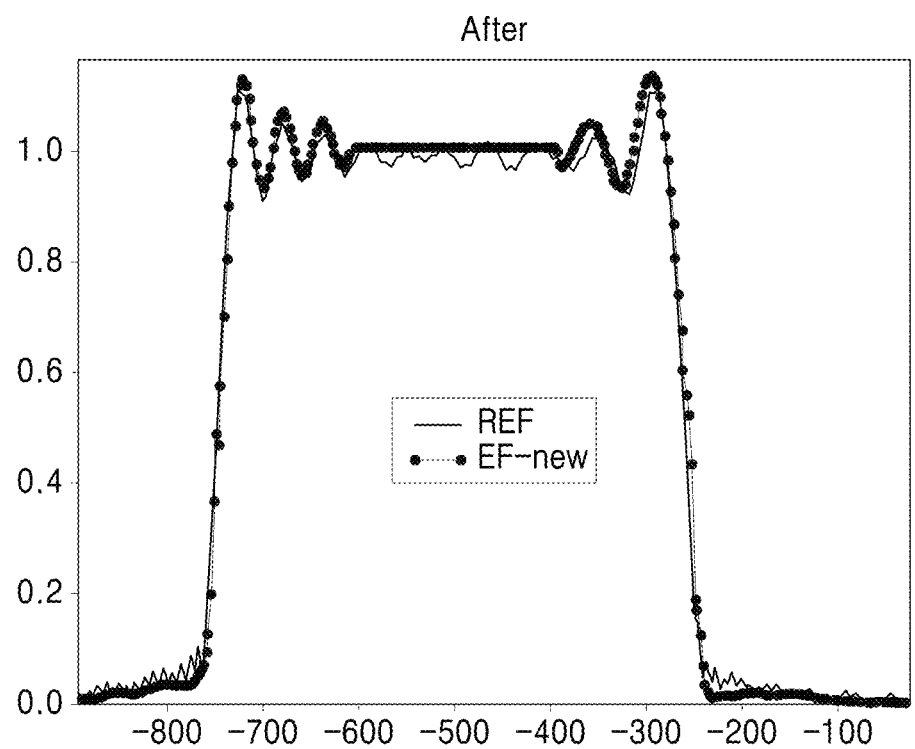

FIGS. 8A and 8B are graphs showing near-field images of a mask having an any-angle 1D pattern to show a difference before and after an any-angle filter is applied to the mask having the any-angle 1D pattern. In each of the graphs, the abscissa denotes positions, the ordinate denotes light intensity, and values on both the abscissa and the ordinate may be expressed in arbitrary units. In FIG. 8A, 'Before' denotes before an any-angle filer used in OPC is applied. In FIG. 8B, 'After' denotes after the any-angle filter is applied. Also, REF denotes a near-field image calculated using an R-SIM, EF-old denotes a near-field image calculated using an edge filter of the related art, and EF-new denotes a near-field image calculated using an edge filter including an any-angle filter.

As can be seen from FIGS. 8A and 8B, the near-field image calculated using the edge filter including the any-angle filter showed almost similar levels of results to those of the near-field image calculated using the R-SIM. Accordingly, it can be predicted that an optical image in which a mask 3D effect is effectively corrected may be generated by applying an any-angle filter to a pattern having a curvilinear edge corresponding to an arbitrary angle. To confirm direct effects on the edge filter including the any-angle filter, two tests may be performed.

Figure 9:
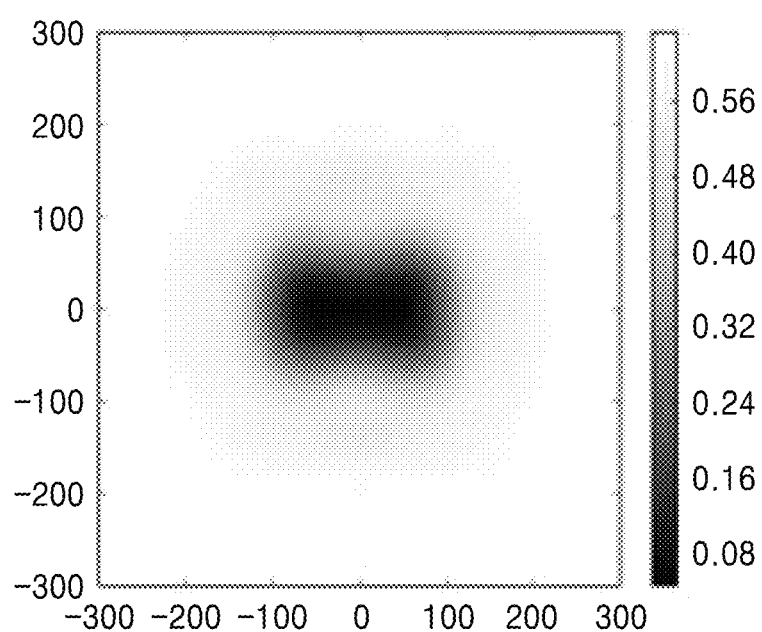
FIG. 9 is a graph showing an optical image calculated by applying a rigorous simulation (R-SIM) to a mask having the pattern of FIG. 3B in a deep ultraviolet (DUV) light source.
Figure 10A:
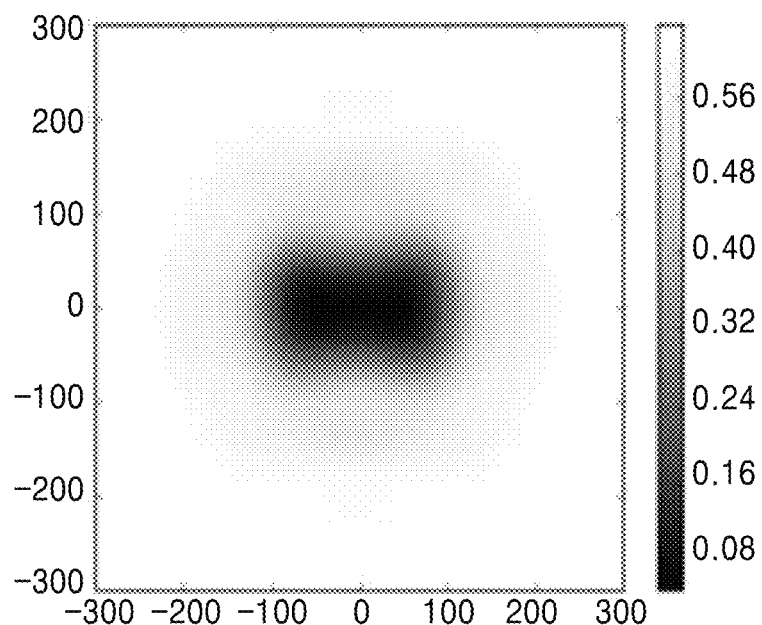
FIG. 10A is a graph showing an optical image obtained by applying an edge filter of the related art to the mask having the pattern of FIG. 3B in the DUV light source.
Figure 10B:
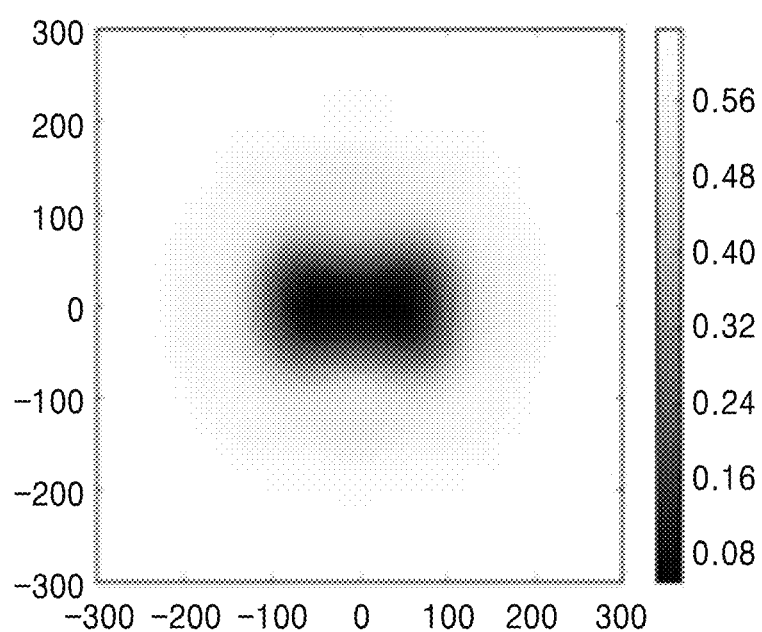
FIG. 10B is a graph showing an optical image obtained by applying an edge filter, which includes an any-angle filter, to the mask having the pattern of FIG. 3B in the DUV light source.
Figure 11A:
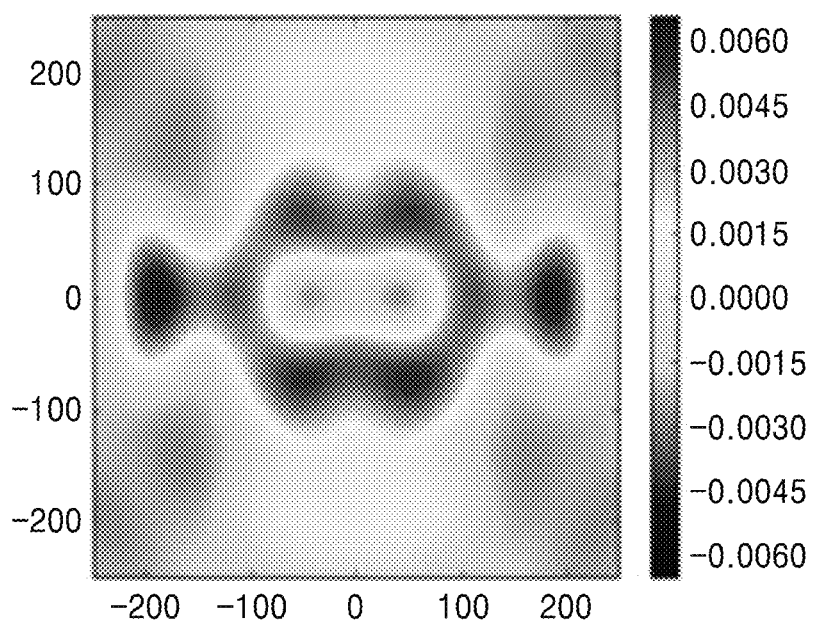
FIG. 11A is a graph showing a difference between the optical image of FIG. 9 and the optical image of FIG. 10A.
Figure 11B:
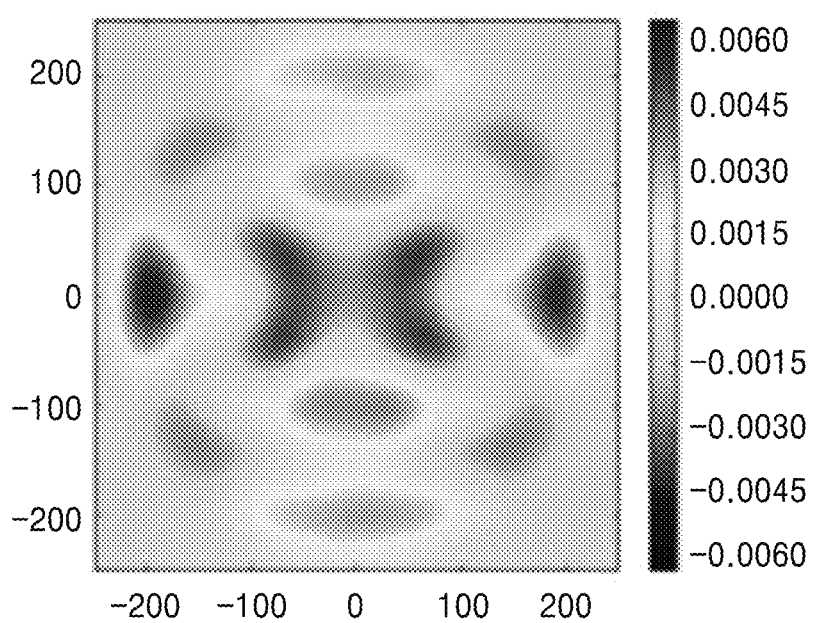
FIG. 11B is a graph showing a difference between the optical image of FIG. 9 and the optical image of FIG. 10B.

FIG. 9 is a graph showing an optical image calculated by applying an R-SIM to a mask having the pattern of FIG. 3B in a DUV light source. FIG. 10A is a graph showing an optical image obtained by applying an edge filter of the related art to the mask having the pattern of FIG. 3B in the DUV light source. FIG. 10B is a graph showing an optical image obtained by applying an edge filter including an any-angle filter to the mask having the pattern of FIG. 3B in the DUV light source. FIG. 11A is a graph showing a difference image between the optical image of FIG. 9 and the optical image of FIG. 10A. FIG. 11B is a graph showing a difference between the optical image of FIG. 9 and the optical image of FIG. 10B. In each of the graphs, the abscissa and the ordinate denote positions, a vertical shaded band on a right side denotes light intensity, and all values may be expressed in arbitrary units.

Referring to FIGS. 9 to 11B, a maximum value of light intensity is about 1.03 in the graph showing the difference image between the optical images of FIGS. 9 and 10A, which is shown in FIG. 11A, whereas the maximum value of light intensity is about 0.91 in the graph showing the difference image between the optical images of FIGS. 9 and 10B, which is shown in FIG. 11B. Accordingly, in the DUV light source, it may be confirmed that the optical image generated using the edge-filter including the any-angle filter is superior by 10% or more to the optical image generated using the edge filter of the related art.

For reference, the higher the light intensity of the difference image is, the greater a difference between the optical image calculated using the R-SIM and the optical image calculated using the edge filter may become. Also, it may be seen that the difference between the optical images occurs due to a mask 3D effect. Accordingly, it may be determined that as the light intensity of the difference image decreases, the mask 3D effect is more effectively corrected in the optical image calculated using the edge filter.

Figure 12:
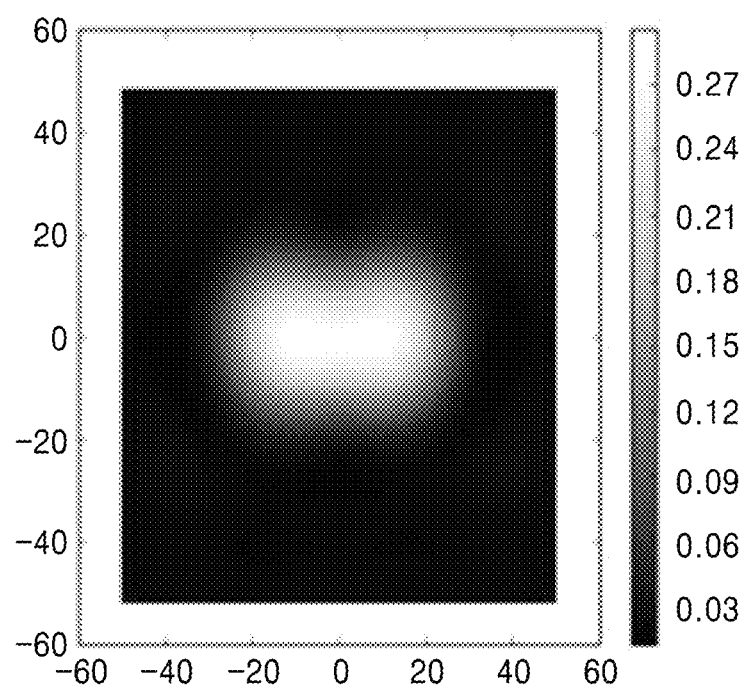
FIG. 12 is a graph showing an optical image calculated by applying an R-SIM to a mask having the pattern of FIG. 3B in an extreme ultraviolet (EUV) light source.
Figure 13A:
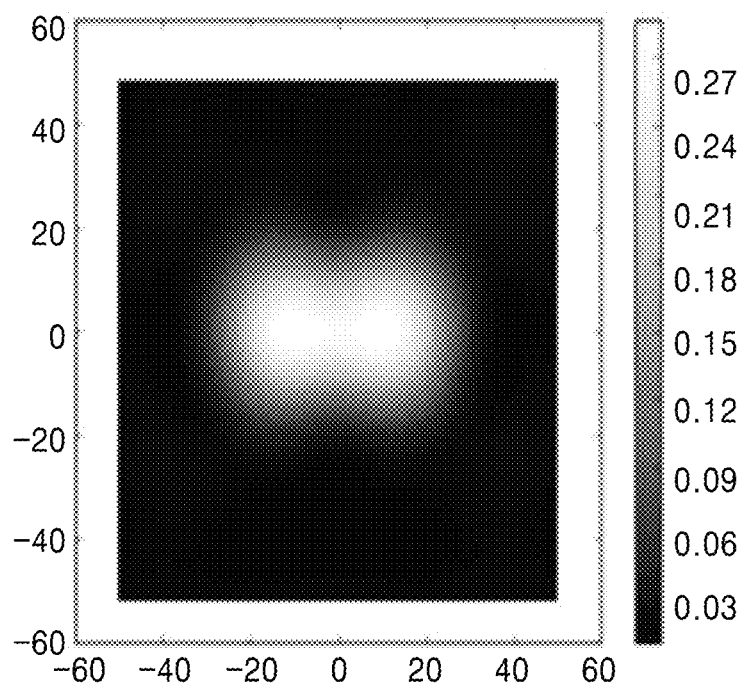
FIG. 13A is a graph showing an optical image obtained by applying an edge filter of the related art to the mask having the pattern of FIG. 3B in the EUV light source.
Figure 13B:
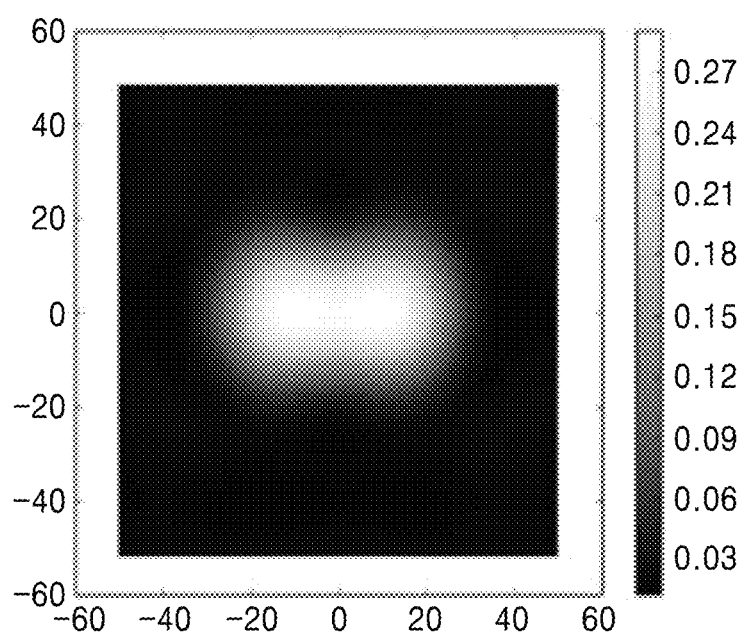
FIG. 13B is a graph showing an optical image obtained by applying an edge filter including an any-angle filter to the mask having the pattern of FIG. 3B in the EUV light source.
Figure 14A:
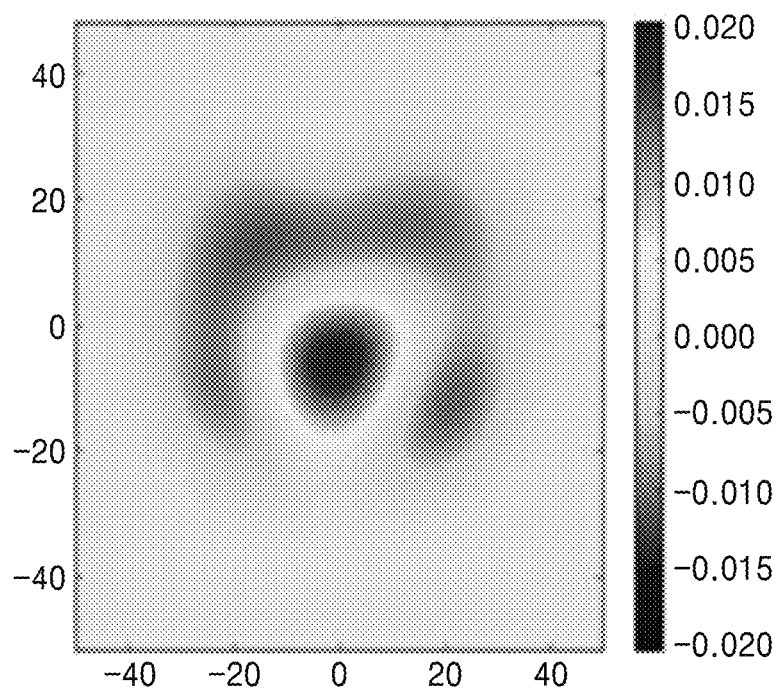
FIG. 14A is a graph showing a difference between the optical image of FIG. 12 and the optical image of FIG. 13A.
Figure 14B:
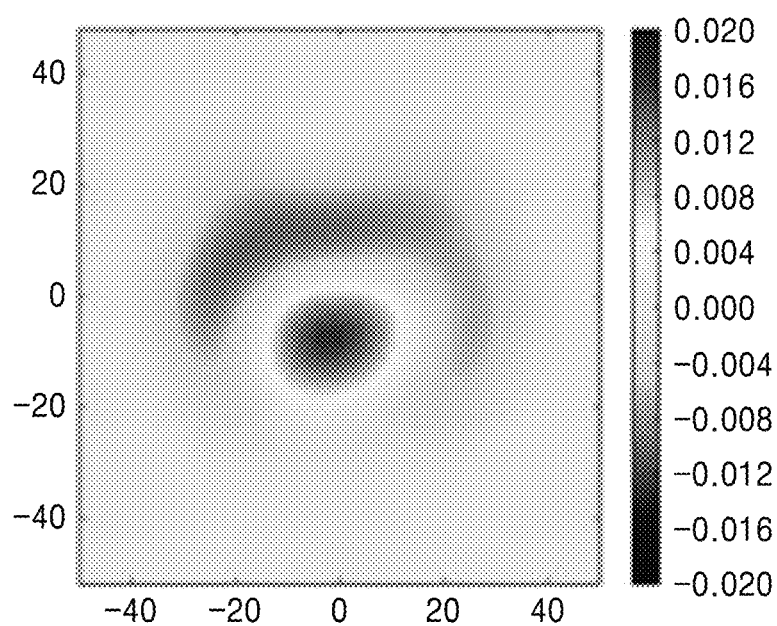
FIG. 14B is a graph showing a difference between the optical image of FIG. 12 and the optical image of FIG. 13B.

FIG. 12 is a graph showing an optical image calculated by applying an R-SIM to a mask having the pattern of FIG. 3B in an EUV light source. FIG. 13A is a graph showing an optical image obtained by applying an edge filter of the related art to the mask having the pattern of FIG. 3B in the EUV light source. FIG. 13B is a graph showing an optical image obtained by applying an edge filter including an any-angle filter to the mask having the pattern of FIG. 3B in the EUV light source. FIG. 14A is a graph showing a difference image between the optical image of FIG. 12 and the optical image of FIG. 13A. FIG. 14B is a graph showing a difference image between the optical image of FIG. 12 and the optical image of FIG. 13B. In each of the graphs, the abscissa and the ordinate denote positions, a vertical shaded band on a right side denotes light intensity, and all values may be expressed in arbitrary units.

Referring to FIGS. 12 to 14B, a maximum value of light intensity is about 6.93 in the graph showing the difference image between the optical images of FIGS. 12 and 13A, which is shown in FIG. 14A, whereas the maximum value of light intensity is about 5.66 in the graph showing the difference image between the optical images of FIGS. 12 and 13B, which is shown in FIG. 14B. Accordingly, in the EUV light source, it may be confirmed that the optical image generated using the edge-filter including the any-angle filter is superior by about 20% to the optical image generated using the edge filter of the related art.

FIGS. 9 to 14B are diagrams illustrating a first test method, which is an image-based analysis method. That is, values calculated using an edge filter of the related art and an edge filter including an any-angle filter may be compared on the basis of values obtained by calculating an optical image, which has passed through a mask having the curvilinear pattern (e.g., a peanut-shaped pattern) shown in FIG. 3B, using an R-SIM. Thus, the accuracy of the optical image in the case of using the edge filter including the any-angle filter may be estimated.

In a second test method, a pattern may be formed on a wafer due to an exposure process using a mask including an actual curvilinear pattern, and actual measurement values of the formed pattern may be used. That is, the accuracy of an optical image may be estimated by comparing actual measurement values of the pattern on the wafer with calculated values of a pattern formed by calibrating an OPC model depending on whether the any-angle filter is used.

In the second test method, as compared to a case in which only the edge filter of the related art is used, it may be confirmed that results obtained by calculating the OPC model using the edge filter including the any-angle filter improved in both the DUV light source and the EUV light source. For instance, an optical RMS value improved by at least 25% in the DUV light source, while an optical RMS value improved by at least 11% in the EUV light source. Here, the optical RMS values may be RMS values of differences between measurement values and values calculated using the OPC model. It may be determined that the smaller the optical RMS value becomes, the closer design data obtained using the OPC model becomes design data capable of forming an actual mask.

Figure 15:
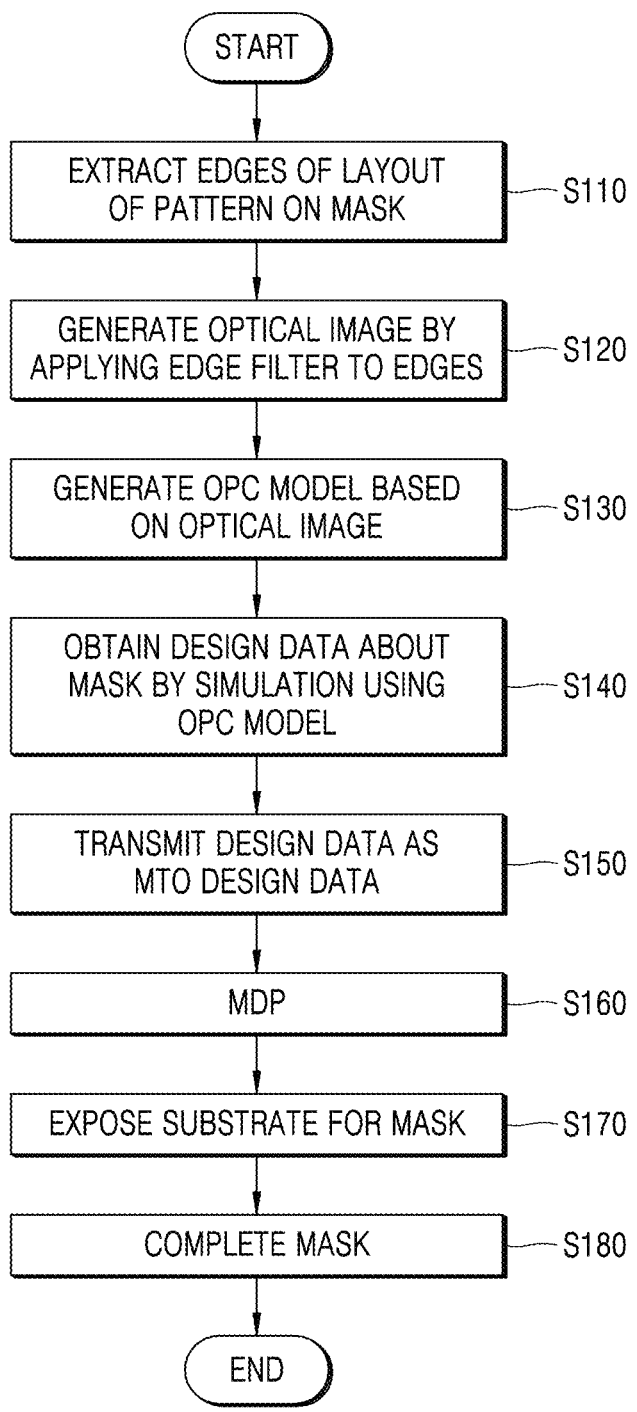
FIG. 15 is a flowchart of operations of a method of manufacturing a mask according to an embodiment.

FIG. 15 is a flowchart of operations of a method of manufacturing a mask according to an embodiment. The same descriptions as in FIGS. 1 to 7D will be briefly provided or omitted. Referring to FIG. 15, in the method of manufacturing the mask according to the present embodiment, to begin with, an OPC method may be performed. The OPC method may include, for example, an operation S110 of extracting an edge to an operation S140 of obtaining design data (S140). The operation S110 of extracting the edges to the operation S140 of obtaining the design data may be the same as the operations S110 to S140 of the OPC method of FIG. 1, which are described above.

After the OPC method is performed, the design data may be transmitted as mask tape-out (MTO) design data (S150). In general, MTO may refer to requesting the manufacture of a mask by passing final mask data obtained by using the OPC method to a mask manufacturing team. Accordingly, the MTO design data may finally correspond to design data about a mask, which is obtained by using the OPC method. The MTO design data may have a graphics data format used in electronic design automation (EDA) software or the like. For example, the MTO design data may have a data format, such as Graphic Data System II (GDS2) and Open Artwork System Interchange Standard (OASIS).

After the MTO design data is transmitted, mask data preparation (MDP) may be performed (S160). The MDP may include, for example, format conversion called fracturing, augmentation of barcodes for mechanical reading, standard mask patterns for inspection, and job decks, and automated and manual verifications. Here, a job-deck may refer to creating a test file of a series of commands, such as information about the arrangement of multiple mask files, a reference dose, an exposure speed or method, and the like.

Meanwhile, format conversion (or fracturing) may refer to a process of fracturing MTO design data for each region and converting the fractured MTO design data into a format for electron-beam (e-beam) exposure equipment. The fracturing process may include, for example, a data manipulation process, such as a scaling process, a data sizing process, a data rotation process, a pattern reflection process, and a color inversion process. During the conversion process using the fracturing process, data about a number of systematic errors that may occur anywhere in a transfer process from the design data to an image on a wafer may be corrected. The process of correcting data about the systematic errors may be referred to as a mask process correction (MPC), which may include, for example, the adjustment of a linewidth, which is called CD adjustment, and an operation of increasing the precision of pattern arrangement. Accordingly, fracturing may contribute to improving the quality of a final mask and be performed beforehand for MPC. Here, the systematic errors may occur due to distortions caused by an exposure process, a mask development process, an etching process, and a wafer imaging process.

Meanwhile, the MDP may include MPC. As described above, the MPC may refer to a process of correcting errors (i.e., systematic errors) caused during an exposure process. Here, the exposure process may be an overall concept including an e-beam writing process, a developing process, an etching process, a baking process, and the like. In addition, a data processing process may be performed before the exposure process. The data processing process may be a kind of process of preprocessing mask data and include performing grammar check on mask data and predicting an exposure time.

After the MDP, a substrate for a mask may be exposed based on the mask data (S170). Here, an exposure process may refer to, for example, an e-beam writing process. For example, the e-beam writing process may be performed in a gray writing manner using a multi-beam mask writer (MBMW). Alternatively, the e-beam writing process may be performed using a variable shape beam (VSB) mask writer.

After the MDP, an operation of converting mask data into pixel data may be performed before an exposure process. The pixel data, which is a data directly used in an actual exposure process, may include data about shapes to be exposed and data about a dose assigned to each of the shapes. Here, the data about the shapes may be bit-map data into which shape data, which is vector data, is converted due to rasterization.

After the exposure process, a mask may be completed by performing a series of processes (S180). The series of processes may include, for example, a developing process, an etching process, and a cleaning process. Also, the series of processes for manufacturing the mask may include a measurement process, a defect inspection process, or a defect repair process. In addition, the series of processes for manufacturing the mask may include a pellicle coating process. The pellicle coating process may refer to a process of attaching pellicle to a surface of the mask to protect the mask from subsequent contamination during the delivery of the mask and a usable lifespan of the mask when it is confirmed that there are no contaminants or chemical stains via final cleaning and inspection processes.

In the method of manufacturing the mask according to the present embodiment, the mask may be a mask for DUV or a mask for EUV. However, the mask is not limited to the mask for DUV or mask for EUV. For example, the mask may be a mask for wavelengths other than DUV or EUV.

In the method of manufacturing the mask according to the present embodiment, an optical image may be generated using an edge filter including an any-angle filter. Thus, the optical image may be generated by effectively correcting a 3D mask effect. Also, an OPC model may be generated based on the optical image, and optimum mask design data may be obtained by performing simulation using the OPC model. Furthermore, in the method of manufacturing the mask according to the present embodiment, the mask may be manufactured by using an exposure process based on the optimum mask design data, thereby implementing an excellent mask capable of effectively forming a target pattern on a wafer.

While the inventive concept has been particularly shown and described with reference to embodiments thereof, it will be understood that various changes in form and details may be made therein without departing from the spirit and scope of the following claims.

What is claimed is:

1. An optical proximity correction (OPC) method, comprising:
   extracting edges of a layout of a pattern on a mask, including at least one edge of the layout that is a curvilinear edge; and
   generating an optical image of the pattern by applying an edge filter, which includes an any-angle filter corresponding to an angle of the curvilinear edge, to the extracted edges of the layout.

2. The OPC method of claim 1, wherein the any-angle filter is generated using source sector rotation to correspond to the angle of the curvilinear edge.

3. The OPC method of claim 1, wherein the edge filter comprises a vertical filter and a horizontal filter, which are applied to an orthogonal edge; and wherein the any-angle filter is expressed by applying a weight to the vertical filter and the horizontal filter, according to the following relationship:

$$AA\text{-filter}=w*V\text{-filter}+(1-w)*H\text{-filter},$$

where "AA-filter" designates the any-angle filter, "V-filter" designates the vertical filter, "H-filter" designates the horizontal filter, and "w" designates the weight.

4. The OPC method of claim 3, wherein w is equivalent to $\sin^2\theta$, where $\theta$ designates an average slope with respect to a horizontal line within a set range of the curvilinear edge.

5. The OPC method of claim 1, wherein the any-angle filter has characteristics that vary as a function of a type of light source used during said generating an optical image.

6. The OPC method of claim 5, wherein the any-angle filter is generated using source sector rotation in a reflective light source.

7. The OPC method of claim 5, wherein the any-angle filter is generated using source sector rotation and polarization decomposition in a transmissive light source.

8. The OPC method of claim 7, wherein polarization decomposition is a method of forming an X, Y, XY, TE, or TM polarization by combining an X polarization and a Y polarization according to positions of a source sector.

9. The OPC method of claim 8, wherein a polarization of the any-angle filter is expressed as a linear sum of an X polarization and a Y polarization of a vertical filter and a horizontal filter by applying the polarization decomposition and a weight.

10. The OPC method of claim 9, wherein the polarization of the any-angle filter is equivalent to:

$$\Delta D_x^x(r)=w \times V_x^x(r)+(1-w) \times \Delta H_x^x(r)(2),$$

where $\Delta(r)$ is a signal value of an edge filter value of an edge viewed from a distance r, $D_x^x$ is an x polarization of the any-angle filter, $V_x^x$ is an x polarization of the vertical filter, $H_x^x$ is an x polarization of the horizontal filter, and "w" designates a weight, which is equivalent to $\sin^2\theta$, where $\theta$ is the angle of the curvilinear edge.

11. The OPC method of claim 1, wherein the optical image is a near-field image comprising a first optical image generated using a thin mask approximation and a second optical image generated using the edge filter.

12. The OPC method of claim 1, wherein said generating the optical image is followed by:
   generating an OPC model based on the optical image; and
   obtaining design data about the mask by performing a simulation using the OPC model.

13. An optical proximity correction (OPC) method, comprising:
   designing a layout of a pattern on a mask;
   extracting edges of the layout, including at least a curvilinear edge;
   generating a first optical image of the pattern using a thin mask approximation;
   generating a second optical image of the pattern by applying an edge filter to the edges of the layout, said edge filter comprising an any-angle filter, which corresponds to an angle of the curvilinear edge.

14. The OPC method of claim 13, wherein the edge filter comprises a vertical filter and a horizontal filter, which are to be applied to an orthogonal edge; and wherein the any-angle filter is obtained by applying a weight to the vertical filter and the horizontal filter, which corresponds to the angle of the curvilinear edge.

15. The OPC method of claim 13, wherein the any-angle filter is generated using source sector rotation in a reflective light source; and wherein the any-angle filter is generated using source sector generation and polarization decomposition in a transmissive light source.

16. The OPC method of claim 15, wherein the polarization decomposition is a method of forming an X, Y, XY, TE, or TM polarization by combining an X polarization and a Y polarization according to positions of a source sector; and wherein a polarization of the any-angle filter is expressed as a linear sum of an X polarization and a Y polarization of a vertical filter and a horizontal filter by applying the polarization decomposition and a weight.

17. The OPC method of claim 13, wherein generating of the final optical image is followed by:
   generating an OPC model based on the final optical image; and
   obtaining design data about the mask by performing a simulation using the OPC model.

18. A method of manufacturing a mask, the method comprising:
   extracting edges of a layout of a pattern on a mask, including at least a curvilinear edge;
   generating an optical image of the pattern by applying an edge filter, which includes an any-angle filter corresponding to an angle of the curvilinear edge, to the edges;
   generating an optical proximity correction (OPC) model based on the optical image;
   obtaining design data about the mask by performing a simulation using the OPC model;
   transmitting the design data as mask tape-out (MTO) design data;
   preparing mask data based on the MTO design data; and
   performing an exposure process on a substrate for the mask, based on the mask data.

19. The method of claim 18, wherein the edge filter comprises a vertical filter and a horizontal filter to be applied to an orthogonal edge; and wherein the any-angle filter is generated by applying a weight to the vertical filter and the horizontal filter, which corresponds to the angle of the curvilinear edge.

20. The method of claim 19, wherein the any-angle filter is expressed by applying a weight to the vertical filter and the horizontal filter, according to the following relationship:

$$AA\text{-filter} = w * V\text{-filter} + (1-w) * H\text{-filter},$$

where "AA-filter" designates the any-angle filter, "V-filter" designates the vertical filter, "H-filter" designates the horizontal filter, and "w" designates the weight; and wherein w is equivalent to $\sin^2\theta$, where $\theta$ designates an angle of the curvilinear edge.

* * * * *